United States Patent
Cok

(10) Patent No.: US 7,259,505 B2
(45) Date of Patent: Aug. 21, 2007

(54) OLED DISPLAY WITH CIRCULAR POLARIZER

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 139 days.

(21) Appl. No.: 10/817,536

(22) Filed: Apr. 1, 2004

(65) Prior Publication Data

US 2004/0189196 A1 Sep. 30, 2004

Related U.S. Application Data

(63) Continuation-in-part of application No. 10/271,149, filed on Oct. 15, 2002, now abandoned.

(51) Int. Cl.
*H01J 5/16* (2006.01)
*H01J 61/40* (2006.01)

(52) U.S. Cl. .................................... 313/112

(58) Field of Classification Search .................. 257/79, 257/88, 98, 99, 100, 40, 81; 313/498, 506, 313/512, 112, 501; 349/96, 98, 99, 100–103, 349/115, 512
See application file for complete search history.

(56) References Cited

U.S. PATENT DOCUMENTS

| | | | | |
|---|---|---|---|---|
| 5,055,894 A | * | 10/1991 | Chan | 257/85 |
| 2002/0056898 A1 | * | 5/2002 | Lopes et al. | 257/682 |
| 2002/0172839 A1 | * | 11/2002 | Van Hal et al. | 428/690 |
| 2004/0179283 A1 | * | 9/2004 | Jones et al. | 359/885 |

* cited by examiner

*Primary Examiner*—B. William Baumeister
*Assistant Examiner*—Dana Farahani
(74) *Attorney, Agent, or Firm*—Andrew J. Anderson

(57) ABSTRACT

A top-emitting OLED display that includes a substrate; an array of OLED light emissive elements formed over the substrate; an encapsulating cover located over the OLED light emissive elements; and a circular light polarizer located between the encapsulating cover and the OLED light emissive elements. The present invention has the advantage that it improves the contrast and robustness of an OLED display by protecting the circular light polarizer from environmental wear and enables the application of additional structures on the top of the encapsulating cover.

20 Claims, 4 Drawing Sheets

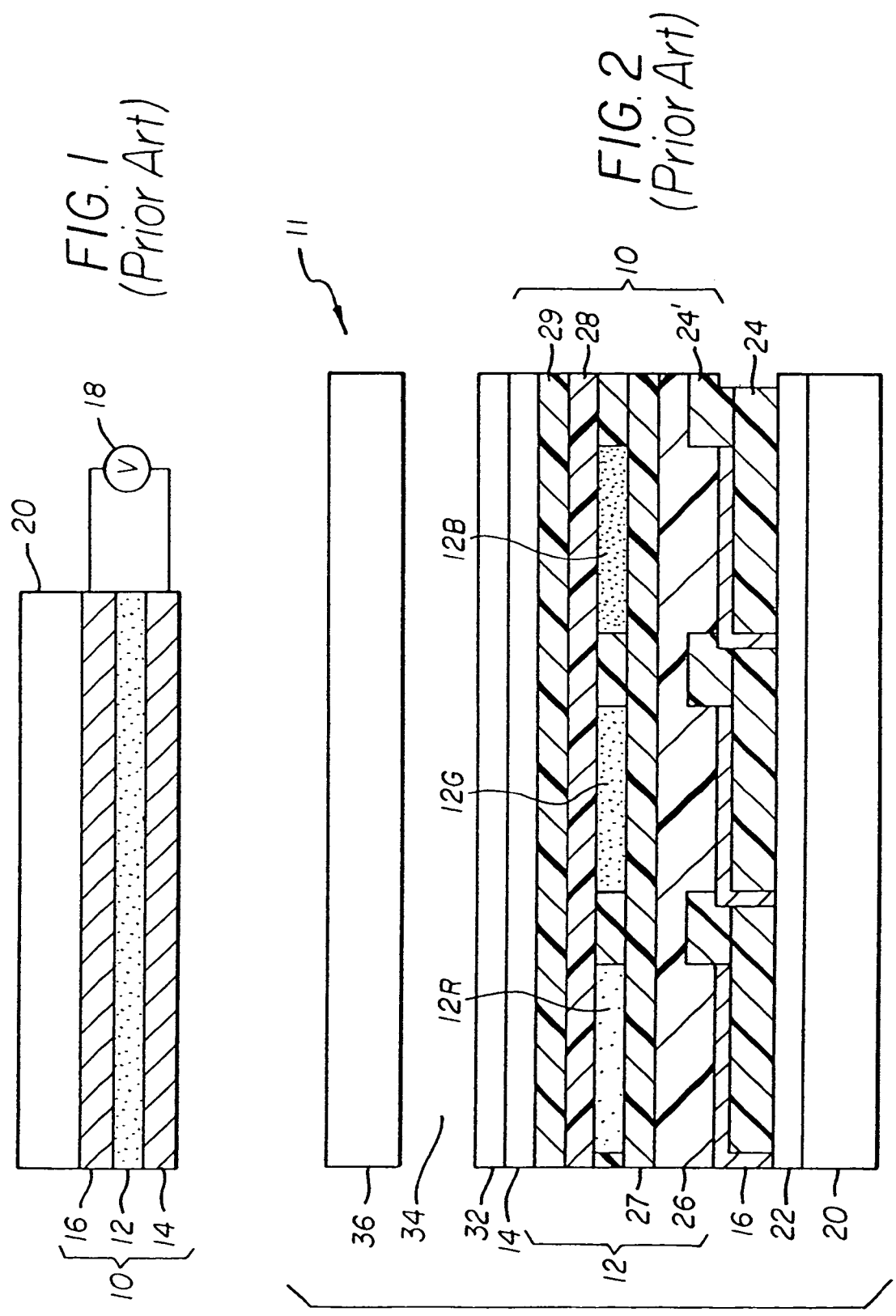

OLED DISPLAY WITH CIRCULAR POLARIZER

CROSS-REFERENCE TO RELATED APPLICATIONS

This is a continuation-in-part of application U.S. Ser. No. 10/271,149, filed Oct. 15, 2002 now abandoned, the disclosure of which is incorporated by reference in its entirety.

FIELD OF THE INVENTION

The present relates to organic light emitting diode (OLED) displays and, more particularly, to such displays having circular polarizing elements to reduce glare and increase the display contrast.

BACKGROUND OF THE INVENTION

Emissive flat-panel display devices are widely used in conjunction with computing devices and in particular with portable devices. These displays are often used in portable devices or in public areas with significant ambient illumination. In these locations, the contrast of the display is of great concern.

In particular, OLED display devices suffer from problems with contrast. It is known to use a circular light polarizer affixed to the surface of the display so that light incident on the display is absorbed by the polarizer, while light emitted by the display is not. This is problematic in that the circular light polarizer is exposed to the environment and is subject to scratching, peeling, moisture, dents, and the like, which reduces its effectiveness and acceptability.

In an attempt to address the problem, WO0210845 A2 entitled "High Durability Circular Polarizer for use with Emissive Displays" published Feb. 7, 2002 describes a high durability circular light polarizer including an unprotected K-type polarizer and a quarter-wavelength retarder and designed for use with an emissive display module such as an organic light emitting diode or a plasma display device. Such devices are expensive and remain subject to environment stress which can degrade their performance. Moreover, placing a circular light polarizer on the surface of the display device inhibits the further integration of other elements such as lenslet arrays and touch screen components over the display.

An additional protective cover may be provided over the circular light polarizer. The LS633 digital camera, sold by Eastman Kodak Company, e.g., employed a polycarbonate cover located over the circular light polarizer to provide environmental protection to the OLED display and circular light polarizer. While such an approach is effective in protecting the display and circular light polarizer, it adds weight, size, and cost to the display. Moreover, modeling and tests done by applicant demonstrate that such a design severely reduces the contrast of the display.

There is a need therefore for an improved OLED display that improves the robustness of the display while maintaining the display contrast.

SUMMARY OF THE INVENTION

The need is met according to the present invention by providing a top-emitting OLED display that includes a substrate; an array of OLED light emissive elements formed over the substrate; an encapsulating cover located over the OLED light emissive elements; and a circular light polarizer located between the encapsulating cover and the OLED light emissive elements.

ADVANTAGES

The present invention has the advantage that it improves the contrast and robustness of an OLED display by protecting the circular light polarizer from environmental wear and enables the application of additional structures on the top of the encapsulating cover.

BRIEF DESCRIPTION OF THE DRAWINGS

FIG. 1 is a schematic diagram of a prior-art OLED;

FIG. 2 is a partial cross section of a prior-art top-emitting OLED display device;

DETAILED DESCRIPTION OF THE INVENTION

Figure 3:
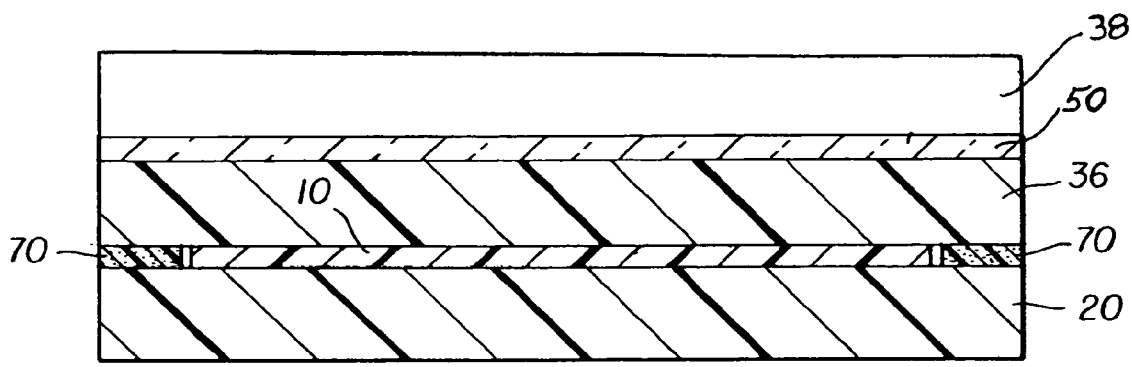
FIG. 3 is a cross section of a top-emitting OLED display device with a circular light polarizer located on the top of the display as suggested by the prior art.

Referring to FIG. 1, a prior-art OLED includes a substrate 20 such as glass or plastic and an OLED light emissive element 10 having an organic light-emitting layer 12 disposed between two electrodes, e.g. a cathode 14 and an anode 16. The organic light emitting layer 12 emits light upon application of a voltage from a power source 18 across the electrodes. It will be understood that the relative locations of the electrodes 14 and 16 may be reversed with respect to the substrate. The light-emitting layer 12 may include other layers such as electron-injection or hole-injection layers as is known in the art.

Referring to FIG. 2, a prior-art top-emitting OLED display device 11 includes a substrate 20, a thin-film transistor (TFT) active-matrix layer 22 that provides power to an OLED light emitting layer 12. A patterned first planarizing insulating layer 24 is provided over the TFT active-matrix layer, and an array of first electrodes 16 are provided over the planarized insulating layer 24 and in electrical contact with the TFT active matrix layer. A patterned second insulating layer 24' is provided over the array of first electrodes 16 such that at least a portion of the each of the first electrodes 16 is exposed and the various electrodes 16 do not form an electrical short circuit.

Over the first electrodes and insulating layers are provided red, green, and blue-emitting organic OLED elements, 12R, 12G, and 12B, respectively. These elements are composed of further layers as described in more detail below. Herein, the collection of OLED elements, including hole-injection 26, hole-transport 27, electron-injection 29, and electron-transport layers 28, may also be referred to as the OLED light-emitting layer 12. The light-emitting area is generally defined by the area of the first electrode 16 in contact with the OLED elements. Over the OLED light-emitting layer 12 is provided a transparent, common second electrode 14 that has sufficient optical transparency to allow transmission of the generated red, green, and blue light. An optional second electrode protection layer 32 may be provided to protect the electrode and underlying layers. Each first electrode in combination with its associated OLED element and second electrode is herein referred to as an OLED light emissive element 10. A typical top-emitting OLED display device comprises an array of OLED light-emitting elements wherein each OLED light-emitting elements emits red, green or blue light. A cavity 34 generally filled with inert gas or a transmissive polymer material, separates the optional electrode protection layer from an encapsulating cover 36.

Referring to FIG. 3, a prior-art top-emitting OLED may be provided with a circular light polarizer 50 that has the property that it will polarize light that passes through the polarizer and will absorb such polarized light that is reflected from the OLED light emissive elements 10 or substrate 20. About half of the light emitted from the light emissive elements 10 passes through the circular light polarizer, but most of the ambient light falling on the device is absorbed by the circular light polarizer. As noted above, the problem with this arrangement is that the circular light polarizer is subjected to the external environment and can be easily scratched and is subject to delamination from the surface of the display device. An optional protective cover 38 may be provided but, as described above, such a cover adds weight, thickness, and cost to the display and reduces contrast by introducing new reflective interfaces.

Figure 4:
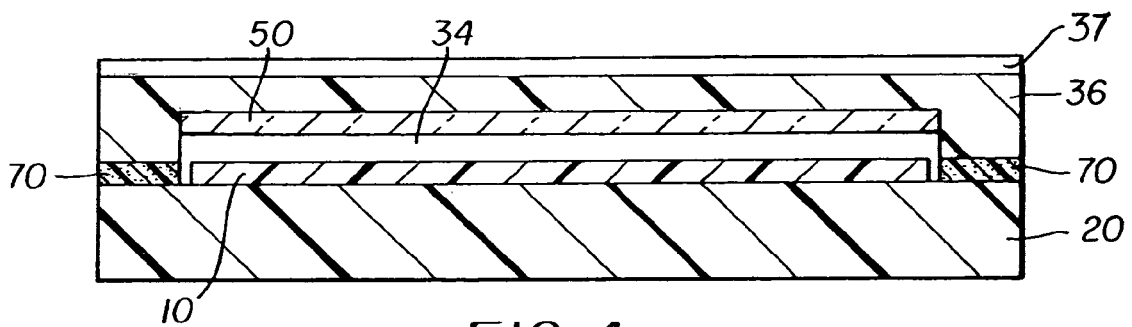
FIG. 4 is a cross section of a top-emitting OLED display according to one embodiment of the present invention.

Referring to FIG. 4, according to the present invention, the circular light polarizer 50 is located between the encapsulating cover and the OLED light emissive elements, thereby protecting the circular light polarizer from the environment. In the preferred embodiment, the encapsulating cover 36 defines a cavity 34 and is affixed to the substrate 20 by a suitable adhesive 70, typically an epoxy. The cavity 34 may be sufficiently deep to leave a gap between the circular light polarizer 50 and the OLED light emissive elements 10. The present invention may include the optional electrode protection layer 32 shown in FIG. 2 to further protect the electrode 14 and layers beneath the electrode. Moreover, the adhesive 70, if it is sufficiently transparent may be used to fill the cavity 34 between the circular light polarizer and the OLED light emissive elements 10. The circular light polarizer 50 may be attached to the inside of the encapsulating cover 36 with a suitable adhesive.

Circular light polarizers are typically made with layers of polymeric materials. In a preferred embodiment, the material used to fill cavity 34 has a refractive index matched more closely than air to the refractive index of the adjacent surface layer of the circular light polarizer, preferably matched to at most 10% difference, more preferably matched to at most 5% difference, and most preferably matched to at most 1% difference. Use of materials in adjacent layers having a common refractive index will reduce reflections and optical interference. For example, the linear polarizer layers of a circular light polarizer can be made with polymers such as triacetate cellulose which has a refractive index of 1.487. More generally, polymers may have a refractive index generally between 1.45 and 1.6 and may be used as a material to fill cavity 34. Theoretically, a material used to fill the cavity 34 may alternatively have a refractive index matched to that of the cathode or cathode protective layer. However, materials conventionally used for a cathode (such as silver or indium tin oxide) have a refractive index very different from that of glass or plastic. For example, indium tin oxide has a refractive index of approximately 1.9.

An adhesive may also be applied between the circular light polarizer 50 and the encapsulating cover 36. If such an adhesive is used, it is preferred that the refractive index of the adhesive also match the refractive index of the adjacent surface of the circular light polarizer. Adhesives with such refractive indices are known. Alternatively, such an adhesive may have a refractive index matched to the encapsulating cover 36. Such covers have a refractive index in the region of 1.5, for example borosilicate glass having a refractive index of 1.51.

In a preferred embodiment, an anti-reflection coating 37 is provided on the encapsulating cover 36 on the side opposed from the circular light polarizer. Such coatings are known in the art and further reduce reflections and optical interference in the display. Additional coatings, such as hardeners, may also be provided to provide environmental protection to the encapsulating cover 36.

Figure 5:
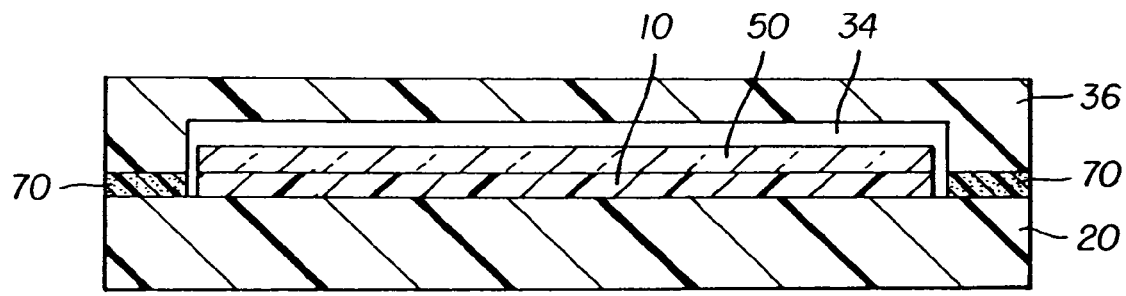
FIG. 5 is a cross section of a top-emitting OLED display according to an alternative embodiment of the present invention.

Referring to FIG. 5, in an alternative embodiment of the present invention, the circular light polarizer 50 is located on top of the OLED light emissive elements 10. In this arrangement, any adhesive used to adhere the circular light polarizer 50 to the OLED light emissive elements 10 should have a refractive index preferably matched to the adjacent surface layer of the circular light polarizer 50 or, alternatively, to the top layer of the OLED light emissive elements 10.

Figure 6:
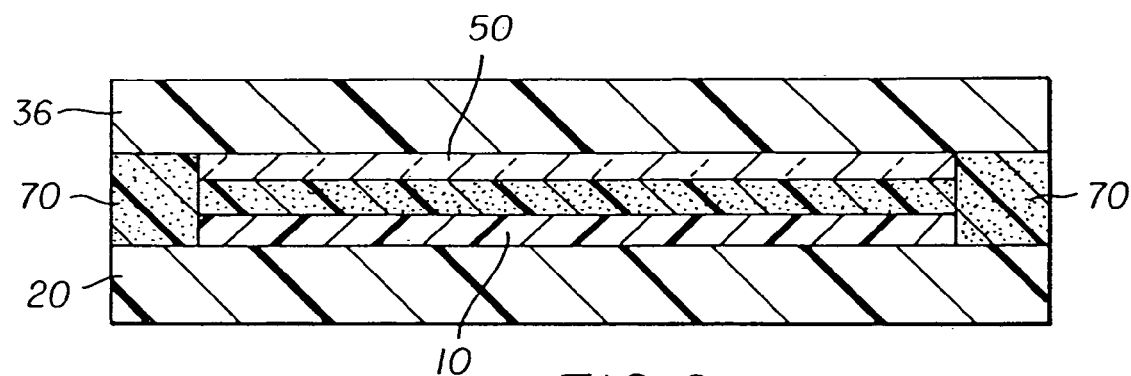
FIG. 6 is a cross section of a top-emitting OLED display according to yet another alternative embodiment of the present invention.

Referring to FIG. 6, in a still further alternative embodiment of the present invention, the encapsulating cover 36 does not define a cavity. The circular light polarizer 50 is attached to the encapsulating cover 36. A transparent adhesive layer 70 hermetically seals the perimeter of the encapsulating cover over the OLED light emissive elements 10 and may extend over the OLED light emissive elements 10. Alternatively, the circular light polarizer 50 may be attached to the OLED light emissive elements 10 and the transparent adhesive extends between the circular light polarizer and the encapsulating cover. In either, case, it is preferred that the adhesive layer 70 have a refractive index matched to that of the adjacent surface layer of the circular light polarizer 50. According to a further alternative, the adhesive 70 may be located only around the periphery of the encapsulating cover and can comprise a light absorbing material.

Figure 7:
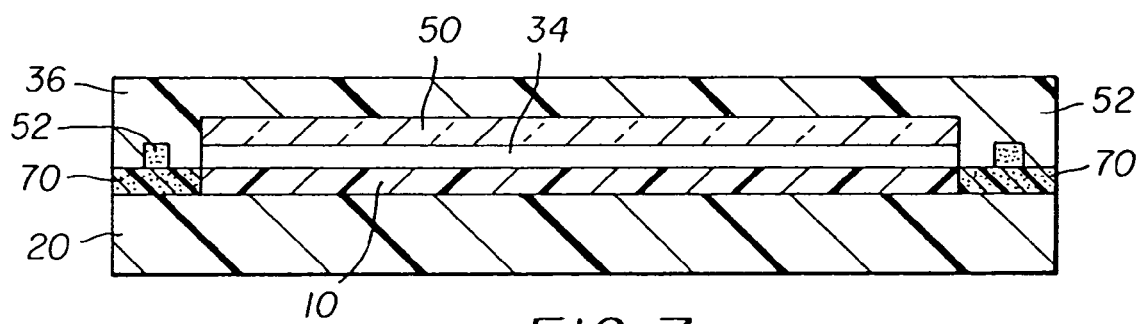
FIG. 7 is a cross section of a top-emitting OLED display according to yet another alternative embodiment of the present invention.
Figure 8:
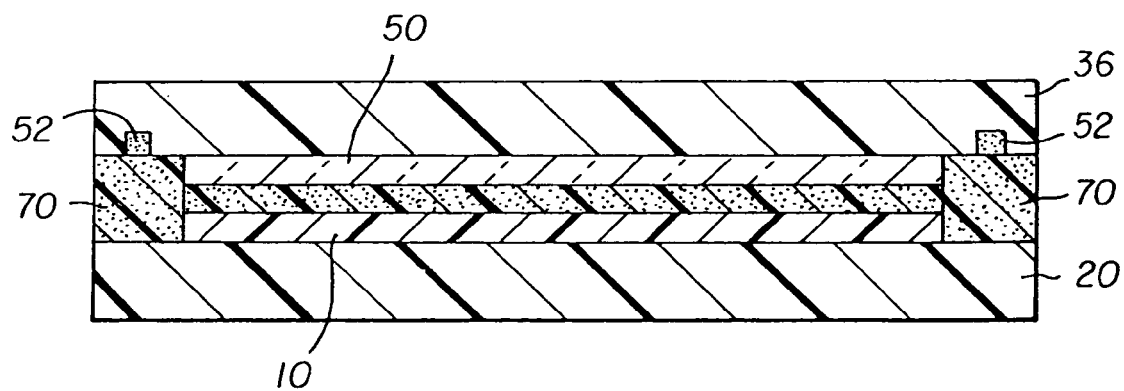
FIG. 8 is a cross section of a top-emitting OLED display according to yet another alternative embodiment of the present invention.

Referring to FIGS. 7 and 8, the encapsulating cover 36 may be provided with a peripheral channel 52 that is filled with a desiccant material. FIG. 7 shows such an arrangement wherein the encapsulating cover defines a cavity over the OLED light emissive elements, and FIG. 8 shows the arrangement wherein the encapsulating cover does not. In either case, a gap filled with an inert gas or light transmissive material may be provided between the circular light polarizer and the encapsulating cover or the OLED light emissive elements. The circular light polarizer may be affixed to the OLED light emissive elements 10 as shown in FIG. 5. As described above, if any cavity filling material is used and located in contact with the circular light polarizer 50, it is preferred that the material have a refractive index matched to that of the adjacent surface layer of the circular light polarizer.

In all of the cases described in FIGS. 4, 5, 6, 7, and 8, it is preferred that an anti-reflective coating be used on the outside face of the encapsulating cover in conjunction with optional environmentally protective coatings. If the cavity

34 is filled with a material, the material preferably has a refractive index matched to that of the adjacent surface layer of the circular light polarizer. Moreover, if the cavity 34 is filled with material, an additional adhesive between the circular light polarizer 50 and the encapsulating cover 36 may not be necessary as the filler material may hold the circular light polarizer in place. Likewise, if the circular light polarizer 50 is located on the OLED light emissive element 10 (as in FIG. 5), an additional adhesive may not be necessary.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al. and U.S. Pat. No. 5,061,569, issued Oct. 29, 1991 to VanSlyke et al. Many combinations and variations of organic light emitting displays can be used to fabricate such a device.

General Device Architecture

The present invention can be employed in most OLED material configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

Figure 9:
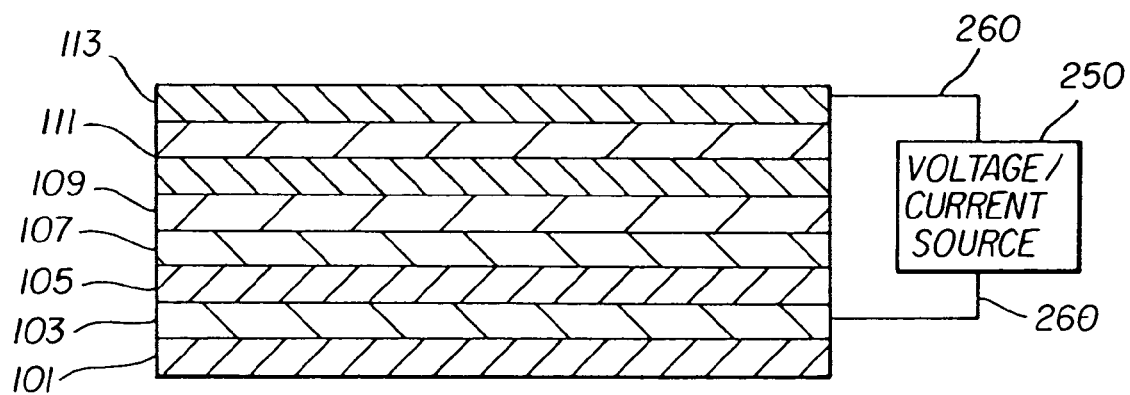
FIG. 9 is a partial cross section of a prior art OLED emitter having multiple layers.

There are numerous configurations of the organic layers wherein the present invention can be successfully practiced. A typical structure is shown in FIG. 9 and is comprised of a substrate 101, an anode 103, a hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be transmissive or opaque. In the case wherein the substrate is transmissive, a reflective or light absorbing layer is used to reflect the light through the encapsulating cover or to absorb the light, thereby improving the contrast of the display. Substrates can include, but are not limited to, glass, plastic, semiconductor materials, silicon, ceramics, and circuit board materials. Of course it is necessary to provide a light-transparent top electrode.

Anode

When EL emission is viewed through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful to provide a hole-injecting layer 105 between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2, 2', 2"-(1,3,5-phenylene) tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

When light emission is viewed solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, U.S. Pat. Nos. 6,278,236, and 6,284,393. Cathode materials are typically deposited by evaporation, sputtering, or chemical vapor deposition. When needed, patterning can be achieved through many well known methods including, but not limited to, through-mask deposition, integral shadow masking, for example, as described in U.S. Pat. No. 5,276,380 and EP 0 732 868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. Nos. 5,683,823, 5,503,910, 5,405,709, and 5,283,182.

Additional layers such as electron or hole-blocking layers as taught in the art may be employed in devices of this invention. Hole-blocking layers are commonly used to improve efficiency of phosphorescent emitter devices, for example, as in US 20020015859.

This invention may be used in so-called stacked device architecture, for example, as taught in U.S. Pat. Nos. 5,703,436 and 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, or providing colored, neutral density, or color conversion filters over the display. Filters, and anti-glare or anti-reflection coatings may be specifically provided over the encapsulating cover or an electrode protection layer beneath the encapsulating cover.

The invention has been described in detail with particular reference to certain preferred embodiments thereof, but it will be understood that variations and modifications can be effected within the spirit and scope of the invention.

PARTS LIST

10 OLED light emissive element
11 top-emitting OLED display device
12 organic light emitting layer
12R red-light emitting OLED layer
12G green-light emitting OLED layer
12B blue-light emitting OLED layer
14 second electrode layer
16 first electrode layer
18 power source
20 substrate
22 TFT active matrix layer
24 first insulating planarization layer
24' second insulating planarization layer
26 hole-injecting layer
27 hole-transporting layer
28 electron-transporting layer
29 electron-injection layer
32 electrode-protection layer
34 cavity
36 encapsulating cover
37 anti-reflection coating
38 optional protective cover 50 circular light polarizer
52 peripheral channel
70 adhesive
101 substrate
103 anode layer
105 hole-injecting layer
107 hole-transporting layer
109 light-emitting layer
111 electron-transporting layer
113 cathode layer
250 voltage/current source
260 conductive wiring

What is claimed is:

1. A top-emitting OLED display comprising:
 a) a substrate;
 b) an array of OLED light emissive elements formed over the substrate;
 c) an encapsulating cover located over the OLED light emissive elements; and
 d) a circular light polarizer located between the encapsulating cover and the OLED light emissive elements, wherein the encapsulating cover defines a cavity over the OLED light emissive elements and the circular light polarizer is attached to the encapsulating cover inside the cavity.

2. The OLED display claimed in claim 1, wherein the cavity defines a gap between the circular light polarizer and the OLED light emissive elements.

3. The OLED display claimed in claim 2, wherein the gap is filled with an inert gas.

4. The OLED display claimed in claim 2, wherein the gap is filled with a transparent solid.

5. A top-emitting OLED display comprising:
 a) a substrate;
 b) an array of OLED light emissive elements formed over the substrate;
 c) an encapsulating cover located over the OLED light emissive elements; and
 d) a circular light polarizer located between the encapsulating cover and the OLED light emissive elements, wherein the encapsulating cover is a flat plate, and further comprising means for hermetically sealing the perimeter of the plate to the substrate.

6. The OLED display claimed in claim 5, wherein the sealing means is light absorbing.

7. The OLED display claimed in claim 5, further comprising means for hermetically sealing the plate to the substrate covering the entire display.

8. The OLED display claimed in claim 1, further comprising a desiccant material located around the perimeter of the encapsulating cover.

9. The OLED display claimed in claim 8, wherein the encapsulating cover defines a peripheral channel and the desiccant material is located in the channel.

10. The OLED display claimed in claim 1, further comprising an anti-reflective coating applied to a side of the encapsulating cover opposite the circular light polarizer.

11. The OLED display claimed in claim 10, further comprising an environmental protection coating provided over or with the anti-reflective coating.

12. The A top-emitting OLED display comprising:
 a) a substrate:
 b) an array of OLED light emissive elements formed over the substrate;
 c) an encapsulating cover located over the OLED light emissive elements;
 d) a circular light polarizer located between the encapsulating cover and the OLED light emissive elements and having a first surface layer having a refractive index: and
 e) a material located adjacent to the first surface layer of the circular light polarizer having a refractive index matched more closely than air to the refractive index of the first surface layer of the circular light polarizer.
 wherein an adhesive is applied to the circular light polarizer to adhere a second surface of the circular light polarizer to the encapsulating cover or to the array of OLED light emissive elements and wherein the refractive index of the adhesive matches the refractive index of the adhered second surface of the circular light polarizer.

13. The OLED display claimed in claim 5, further comprising a desiccant material located around the perimeter of the encapsulating cover.

14. The OLED display claimed in claim 13. wherein the encapsulating cover defines a peripheral channel and the desiccant material is located in the channel.

15. The OLED display claimed in claim 5, further comprising an anti-reflective coating applied to a side of the encapsulating cover opposite the circular light polarizer.

16. The OLED display claimed in claim 15, further comprising an environmental protection coating provided over or with the anti-reflective coating.

17. The OLED display claimed in claim 1, wherein an adhesive is applied to the circular light polarizer to adhere a surface of the circular light polarizer to the encapsulating cover or to the array of OLED light emissive elements and wherein the refractive index of the adhesive matches the refractive index of the adhered surface of the circular light polarizer.

18. The OLED display claimed in claim 1, wherein an adhesive is applied to the circular light polarizer to adhere a surface of the circular light polarizer to the encapsulating cover and wherein the refractive index of the adhesive matches the refractive index of the encapsulating cover.

19. The OLED display claimed in claim 5, wherein an adhesive is applied to the circular light polarizer to adhere a surface of the circular light polarizer to the encapsulating cover or to the array of OLED light emissive elements and wherein the refractive index of the adhesive matches the refractive index of the adhered surface of the circular light polarizer.

20. The OLED display claimed in claim 5, wherein an adhesive is applied to the circular light polarizer to adhere a surface of the circular light polarizer to the encapsulating cover and wherein the refractive index of the adhesive matches the refractive index of the encapsulating cover.

* * * * *

UNITED STATES PATENT AND TRADEMARK OFFICE
CERTIFICATE OF CORRECTION

PATENT NO. : 7,259,505 B2 Page 1 of 1
APPLICATION NO. : 10/817536
DATED : August 21, 2007
INVENTOR(S) : Ronald S. Cok It is certified that error appears in the above-identified patent and that said Letters Patent is hereby corrected as shown below:

| | |
|---|---|
| Claim 12, column 12, line 1. | In claim 12, before "A" delete "The". |
| Claim 12, column 12, line 2. | In claim 12, delete "substrate:" and insert -- substrate --, therefor. |
| Claim 12, column 12, line 9 | In claim 12, delete "index:" and insert -- index; --, therefor. |
| Claim 12, column 12, line 14. | In claim 12, delete "polarizer." and insert -- polarizer, --, therefor. |
| Claim 14, column 12, line 25. | In claim 14, delete "13." and insert -- 13, --, therefor. |

Signed and Sealed this

Twentieth Day of November, 2007

JON W. DUDAS
*Director of the United States Patent and Trademark Office*